(12) United States Patent
Kim et al.

(10) Patent No.: US 10,068,981 B2
(45) Date of Patent: Sep. 4, 2018

(54) RARE EARTH METAL SURFACE-ACTIVATED PLASMA DOPING ON SEMICONDUCTOR SUBSTRATES

(71) Applicant: Lam Research Corporation, Fremont, CA (US)

(72) Inventors: Yunsang Kim, Monte Sereno, CA (US); Reza Arghavani, Scotts Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/059,208

(22) Filed: Mar. 2, 2016

(65) Prior Publication Data

US 2017/0256622 A1   Sep. 7, 2017

(51) Int. Cl.

| H01L 21/324 | (2006.01) |
|---|---|
| H01L 29/66 | (2006.01) |
| H01L 21/225 | (2006.01) |
| H01L 29/45 | (2006.01) |
| H01L 21/285 | (2006.01) |
| H01L 21/288 | (2006.01) |

(52) U.S. Cl.
CPC .......... *H01L 29/45* (2013.01); *H01L 21/2252* (2013.01); *H01L 21/288* (2013.01); *H01L 21/28556* (2013.01); *H01L 21/28568* (2013.01); *H01L 21/324* (2013.01); *H01L 29/66795* (2013.01)

(58) Field of Classification Search
CPC ... H01L 29/45; H01L 21/324; H01L 21/2252; H01L 21/28568; H01L 21/28556; H01L 21/288; H01L 29/66795

IPC ................................ H01L 29/45,29/66, 21/225
See application file for complete search history.

(56) References Cited

U.S. PATENT DOCUMENTS

| 4,728,626 A | * | 3/1988 | Tu ..................... H01L 21/02381 117/9 |
|---|---|---|---|
| 6,528,856 B1 | * | 3/2003 | Bai .................... H01L 21/28185 257/410 |
| 7,723,762 B2 | * | 5/2010 | Kim .................. H01L 29/41791 257/288 |
| 7,863,121 B2 | * | 1/2011 | Jang .................. H01L 29/66409 257/E29.148 |
| 7,999,298 B2 | * | 8/2011 | Kavalieros ........ H01L 27/10867 257/301 |

(Continued)

FOREIGN PATENT DOCUMENTS

| EP | 0 162 950 | 1/1988 |
|---|---|---|
| KR | 10-0329206 | 3/2002 |

OTHER PUBLICATIONS

U.S. Appl. No. 14/929,039, filed Oct. 30, 2015, entitled "Contact Integration for Reduced Interface and Series Contact Resistance."

*Primary Examiner* — Savitr Mulpuri
(74) *Attorney, Agent, or Firm* — Weaver Austin Villeneuve & Sampson LLP

(57) ABSTRACT

Methods of doping semiconductor substrates using deposition of a rare earth metal-containing film such as an yttrium-containing film, and annealing techniques are provided herein. Rare earth metal-containing films are deposited using gas, liquid, or solid precursors without a bias and may be deposited conformally. Some embodiments may involve deposition using a plasma. Substrates may be annealed at temperatures less than about 500° C.

14 Claims, 17 Drawing Sheets

(56) References Cited

U.S. PATENT DOCUMENTS

| | | | |
|---|---|---|---|
| 8,865,543 B2 * | 10/2014 | Huang | H01L 29/78 |
| | | | 257/E21.006 |
| 9,153,486 B2 | 10/2015 | Arghavani et al. | |
| 9,466,693 B1 * | 10/2016 | Alptekin | H01L 29/66545 |
| 2010/0155954 A1 * | 6/2010 | Mukherjee | H01L 21/76814 |
| | | | 257/754 |

* cited by examiner

RARE EARTH METAL SURFACE-ACTIVATED PLASMA DOPING ON SEMICONDUCTOR SUBSTRATES

BACKGROUND

In integrated circuit (IC) manufacturing, semiconductor devices such as the transistors are fabricated on a silicon substrate and then connected together to perform the desired circuit functions. This connection process is generally called "metallization", and can be performed using a number of photolithographic patterning, etching, and deposition steps.

To form the connections, metallization layers include vias and interconnect structures that function as electrical pathways to interconnect the semiconductor devices. In the metallization layers, the interconnect structures and vias form a contact with the substrate to form a metal-semiconductor contact. However, direct metal to semiconductor contact may be highly resistive. As devices scale smaller and smaller, such resistivity can be highly undesirable.

SUMMARY

Provided herein are methods of processing substrates. One aspect involves a method of processing a substrate housed in a plasma chamber by introducing a rare earth metal source to the process chamber; depositing a conformal rare earth metal-containing film over a semiconductor material on the substrate; and annealing the substrate at a temperature less than 500° C. to form a rare earth metal-doped semiconductor material on the surface of the substrate.

In various embodiments, the rare earth metal source includes a plasma generated by igniting a rare earth metal-containing precursor. The conformal rare earth metal-containing film may be deposited to a thickness between about 2 nm and about 5 nm. The conformal rare earth metal-containing film may be deposited without applying a bias. The rare earth metal-containing film may be deposited over a source or drain region of a transistor. In some embodiments, the transistor is a FinFET.

The substrate may be annealed using rapid thermal annealing. In some embodiments, the substrate is patterned. The substrate may include features having feature openings of less than about 10 nm. In some embodiments, the features have aspect ratios greater than about 1.5:1.

In various embodiments, the rare earth metal source includes yttrium.

The rare earth metal source may be a liquid. In some embodiments, the rare earth metal source has a boiling point between about 60° C. and about 300° C.

The rare earth metal source may be a solid. In some embodiments, the rare earth metal source is any one of tris(butylcyclopentadienyl)yttrium(III), tris(cyclopentadienyl)yttrium(III), tris[N,N-bis(trimethylsilyl)amide]yttrium, yttrium(III) fluoride, yttrium(III) iodide, and yttrium(III) chloride. In certain embodiments, the rare earth metal source may be tris(butylcyclopentadienyl) yttrium(III).

The semiconductor metal may be any one of silicon, silicon germanium, germanium, and silicon carbide. In some embodiments, the doped semiconductor material is not a silicide.

In various embodiments, the method further includes, prior to introducing the rare earth metal source to the process chamber and prior to depositing the conformal rare earth metal-containing film, pre-cleaning the substrate by exposing the substrate to hydrofluoric acid.

Another aspect involves an apparatus for processing a semiconductor substrate including a semiconductor material, the apparatus including: one or more process chambers, whereby at least one process chamber includes a heated pedestal for heating the semiconductor substrate; one or more gas inlets into the process chambers and associated flow-control hardware; and a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: introducing a rare earth metal source to the process chamber to deposit a conformal rare earth metal-containing film over the semiconductor material on the substrate; and heating the substrate at a temperature less than 500° C. to form a rare earth metal-doped semiconductor material on the surface of the substrate.

The apparatus may further include a plasma generator, whereby the rare earth metal source includes a plasma generated by igniting a rare earth metal-containing precursor. The apparatus may further include an environmentally closed chamber for cleaning the semiconductor substrate. In some embodiments, the apparatus further includes a robot capable of moving the semiconductor substrate between the environmentally closed chamber and the one or more process chambers without an air break. In some embodiments, the apparatus may also include a solid source evaporator for vaporizing a solid source.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Although the disclosed embodiments may be used in a variety of applications, one useful application is in fabrication of transistors, which include metal oxide semiconductor (MOS) field-effect transistors. MOS transistors can include two types: negative channel metal oxide semiconductor (NMOS) transistors and positive channel metal oxide semiconductor (PMOS) transistors. The transistors and other devices may be interconnected using interconnect structures to form ICs.

Figure 1:
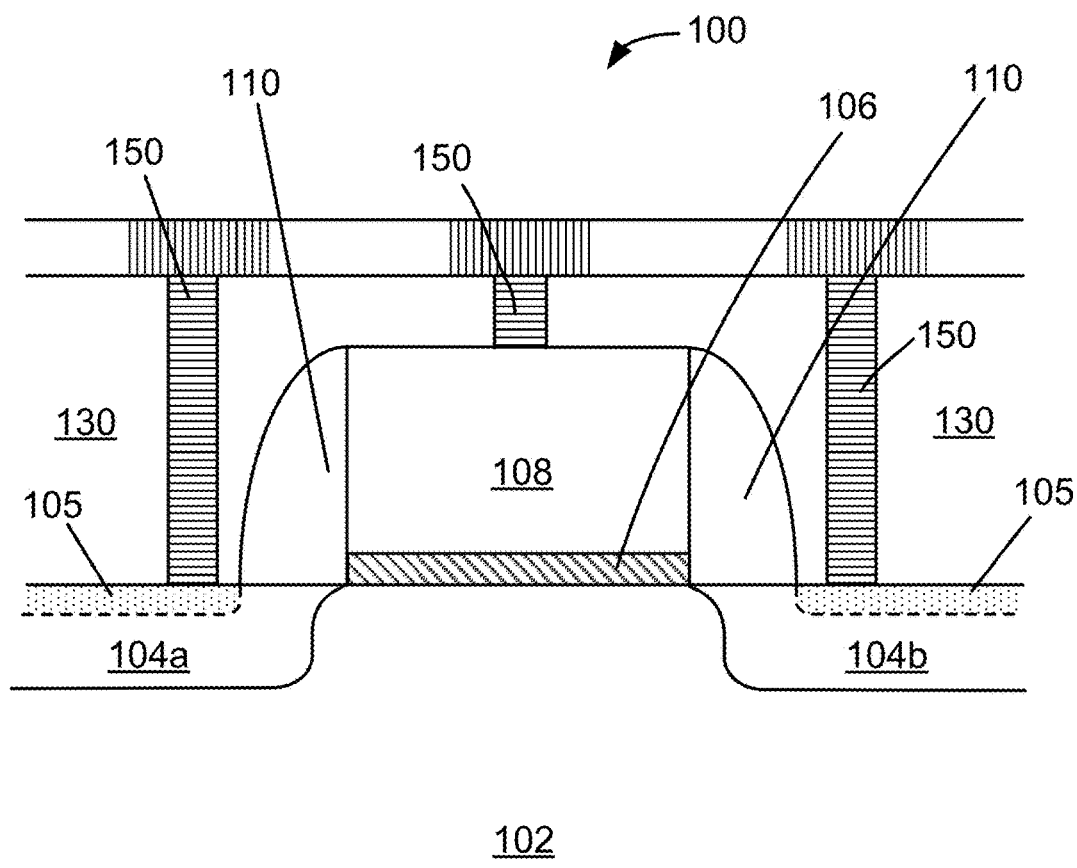
FIG. 1 shows a cross-section schematic view of a conventional semiconductor device, such as a transistor device, with a silicide.

FIG. 1 shows a cross-section schematic view of a transistor with silicide layers. The transistor 100 can be formed on a substrate 102, which is typically made of a semiconducting material, such as silicon. The transistor 100 includes a gate dielectric 106, a gate electrode 108, spacers 110, source region 104a, and drain region 104b. A pre-metal dielectric (PMD) layer 130 is formed over the transistor 100 and the substrate 102. Vias are formed within the PMD layer 130.

Vias may be pre-cleaned to remove any oxides on the surface of the substrate 102. For example, the substrate 102 may be pre-cleaned using a wet technique involving exposure of the substrate to hydrofluoric acid (HF) to remove oxide from the surface. After the substrate 102 is precleaned, the vias may be filled with electrically conductive material such that metal is deposited over the source and drain regions 104a and 104b of substrate 102 to form electrical contacts 150. The metal can include any metal that is capable of reacting with silicon or germanium to form a silicide or germanide layer 105, respectively. Examples of such metals include titanium (Ti), tantalum (Ta), tungsten (W), cobalt (Co), nickel (Ni), platinum (Pt), palladium (Pd), and alloys thereof. Deposition of the metals can be achieved using conventional deposition techniques, such as chemical vapor deposition (CVD), physical vapor deposition (PVD), sputtering, evaporation, plating, and the like. The electrically conductive material in the vias form electrical contacts 150 that electrically connect with the gate electrode 108 as well as the source and drain regions 104a and 104b of the substrate 102. To enhance the electrical connection, silicide layers 105 are formed on the surface of the source and drain regions 104a and 104b, as illustrated in FIG. 1. The silicide layers 105 reduce the electrical resistance between the electrical contacts 150 and the source and drain regions 104a and 104b. The metal may be annealed to form the silicide or germanide layers 105 using annealing techniques such as rapid thermal processing (RTP) anneal or laser anneal. The annealing can be performed at a temperature between about 300° C. and about 3000° C. Upon formation of the silicide after annealing, unreacted metal portions may be etched away using conventional etching techniques. Any of these steps may be repeated to form the silicide or germanide layers 105.

Figure 2:
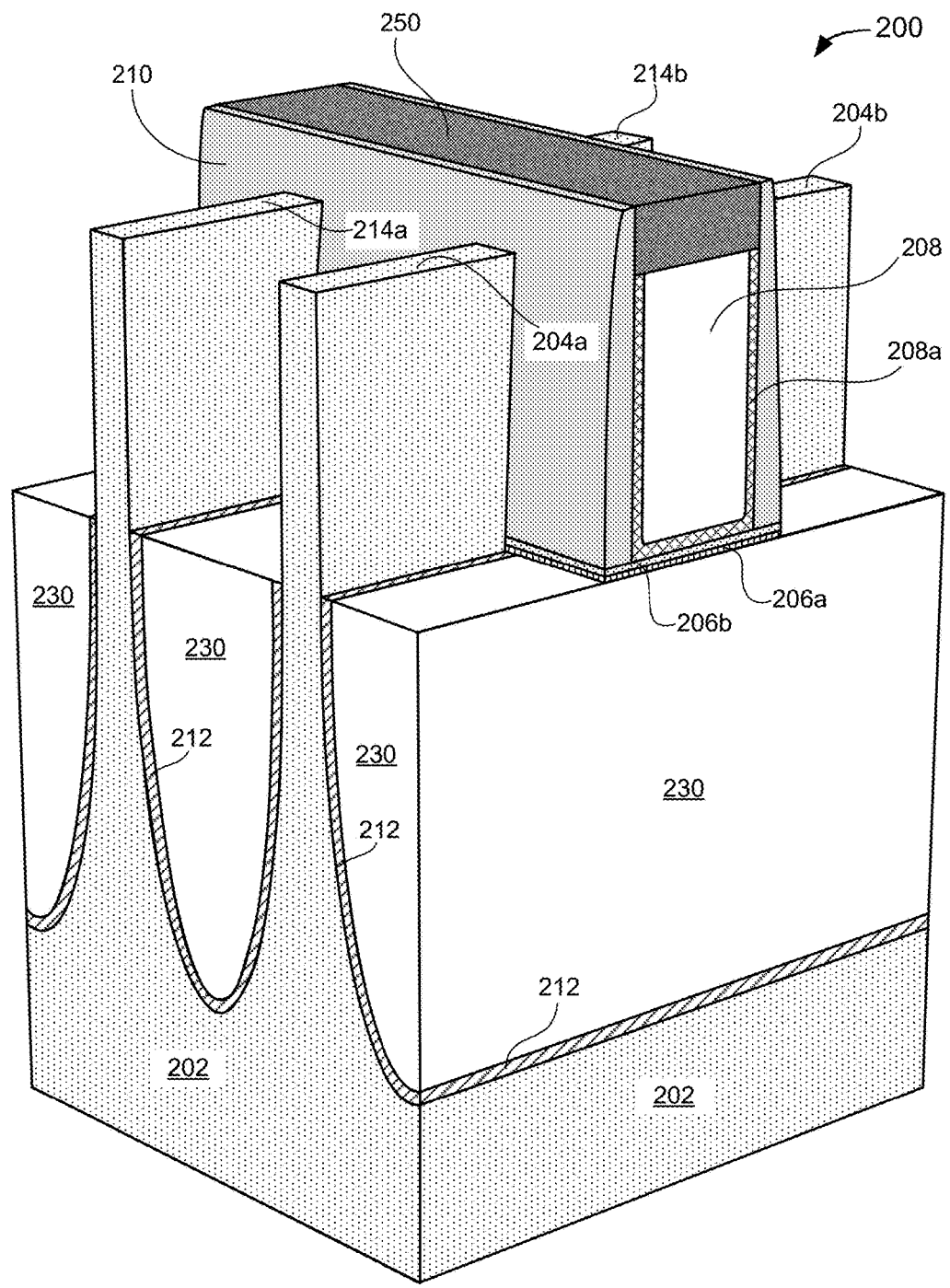
FIG. 2 shows a three-dimensional schematic view of a FinFET semiconductor device.

FIG. 2 shows an example FinFET structure (fin-shaped field effect transistor) 200. Substrate 202 may be a semiconductor substrate. In this structure, surfaces 214a and 204a correspond to source regions, while 214b and 204b correspond to drain regions. Liner 212 separates the semiconductor material of substrate 202 from the insulator material 230 such as silicon oxide. Thin gate dielectric layers 206b and 206a may be deposited over the insulator material 230 and may separate the insulator material 230 from the gate, which includes spacers 210, gate electrode 208, and gate electrode barrier 208a. Electrical contact 250 is formed over the top of the gate. Like FIG. 1, although silicide layers may be formed at source regions 214a and 204a and drain regions 214b and 204b, conventional techniques are insufficient to form a low resistivity contact in small devices.

As devices shrink, the transistor structure shrinks and the source and drain regions are moved closer and closer together. As a result, doped surfaces of the source and drain regions to reduce resistivity between the semiconductor material and the electrically conductive contact material, such as tungsten, are to be maintained shallow enough to reduce the resistivity without affecting the function of the transistor. However, current techniques for doping semiconductor material to reduce resistivity in small critical dimension vias may require complex multi-layer doping techniques and are inefficient.

Figure 3:
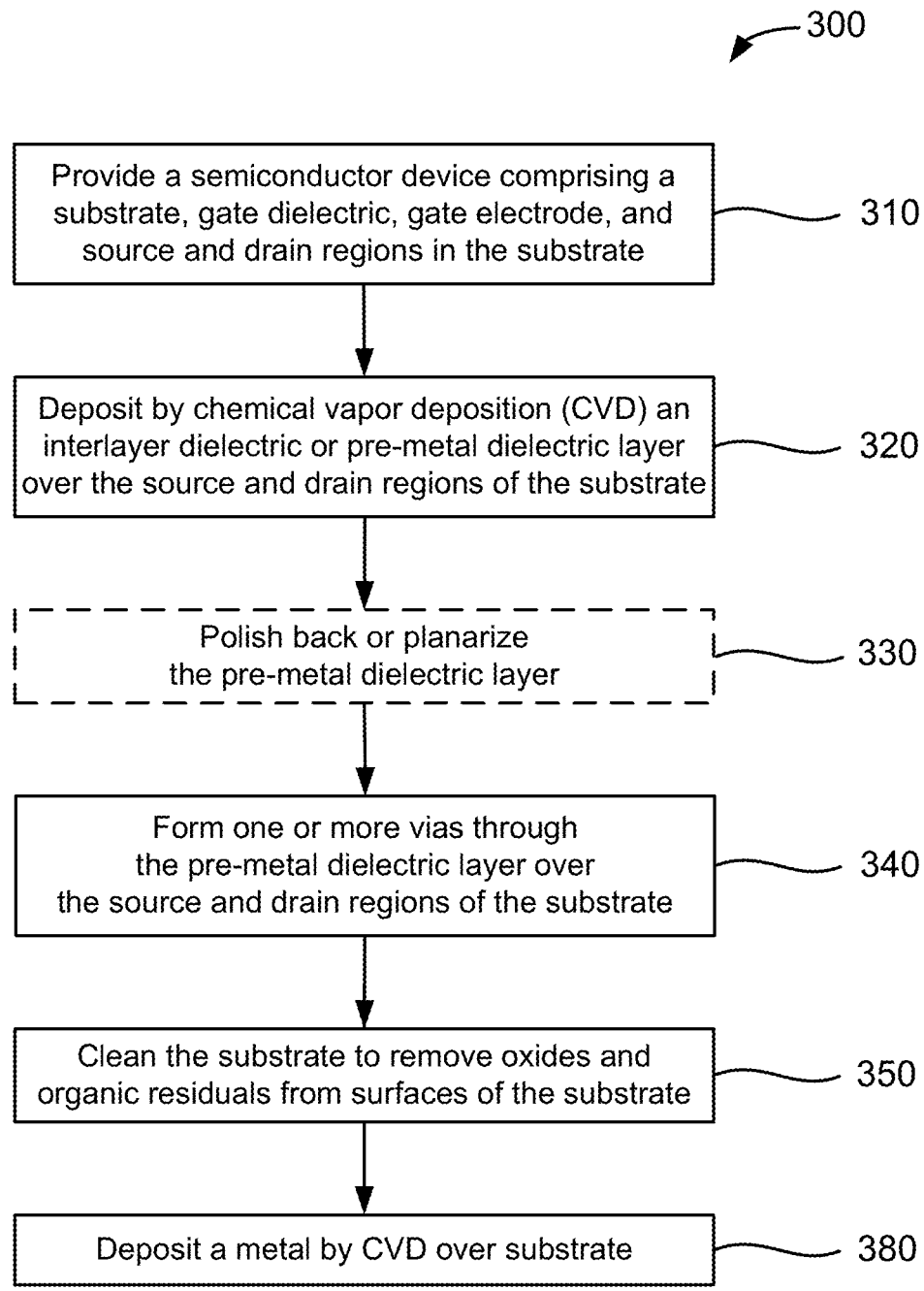
FIG. 3 shows a process flow diagram illustrating a method of manufacturing an interconnect structure of a semiconductor device.

FIG. 3 shows an example process flow diagram for forming a transistor using conventional techniques with corresponding schematic illustrations of an example transistor undergoing various operations in FIG. 4A-4E. FIG. 4A-4E depict cross-section schematic views of various stages of in a method of manufacturing an interconnect structure of a semiconductor device. Note that while FIG. 4A-4E depict a field effect transistor, the same or similar process flow may be applied to a FinFET or other transistor structure. Operations discussed in FIG. 3 will be discussed with respect to corresponding cross-section schematic views in FIG. 4A-4E.

In FIG. 3, the process 300 begins with operation 310 where a semiconductor device is provided. The semiconductor device includes a substrate, a gate dielectric formed over the substrate, a gate electrode formed over the gate dielectric, and source and drain regions in the substrate and on laterally opposite sides of the gate electrode. The semiconductor device can be a transistor device, such as a MOS field-effect transistor device.

Figure 4A:
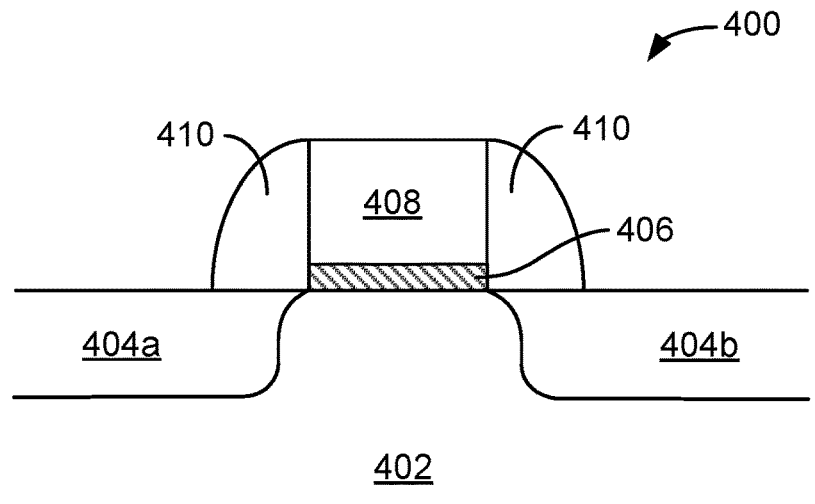
FIG. 4A-4E show cross-section schematic views of various stages in a method of manufacturing an interconnect structure of a semiconductor device.

FIG. 4A shows an example of a cross-section schematic view of a semiconductor device 400, such as a transistor device. The semiconductor device 400 includes a substrate 402. The substrate 402 can include any semiconducting material, such as silicon, germanium, indium antimonide, lead telluride, indium arsenide, indium phosphide, gallium arsenide, and gallium antimonide, among others. In some embodiments, the substrate 402 may be formed using bulk silicon, or a silicon-on-insulator (SOI) structure. However, it is understood that any semiconductor structures as is well known in the art may be used for the substrate 402.

The semiconductor device 400 also includes a gate dielectric 406 over the substrate 402, and a gate electrode 408 over the gate dielectric 406. Source and drain regions 404a and 404b respectively may be formed in the substrate 402 and on laterally opposite sides of the gate dielectric 406. In some embodiments, the source and drain regions 404a and 404b respectively may be n-doped or p-doped, using doping processes. Spacers 410 may be formed on laterally opposite sides of the gate dielectric 406 and over the substrate 402.

Returning to FIG. 3, in operation 320, a pre-metal dielectric (PMD) layer is deposited over the substrate. Note that in some embodiments, an interfacial layer (not shown) may have been deposited between operation 310 and operation 320 separating the source and drain regions from the PMD layer. The PMD layer may be deposited over the interfacial dielectric using any conventional deposition method known in the art. In some implementations, deposition by CVD of both the PMD layer and the interfacial dielectric can be performed without introducing a vacuum break.

Figure 4B:
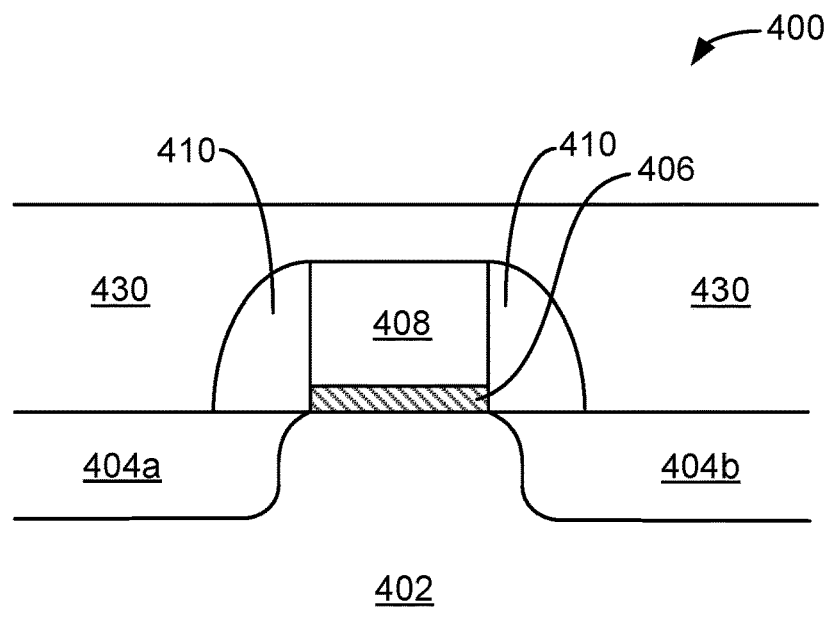

FIG. 4B shows an example of a cross-section schematic view of the partially fabricated interconnect structure of the semiconductor device 400. FIG. 4B shows a thick layer of a PMD layer 430 deposited over the source and drain regions 404a and 404b. In some instances, the PMD layer 430 may also be referred to as an interlayer dielectric (ILD) layer. The PMD layer 430 may be formed of any dielectric material. In some embodiments, the dielectric material can have a relatively low dielectric constant. Examples of dielectric materials can include silicon oxide ($SiO_2$), carbon doped oxide (CDO), silicon nitride ($Si_3N_4$), polymers such as perfluorocyclobutane (PFCB) and polytetrafluoroethylene (PTFE), fluorosilicate glass (FSG), and organosilicate glass. The PMD layer 430 may include pores or other voids to further reduce its dielectric constant.

Returning to FIG. 3, in operation 330, the PMD layer may be optionally polished or planarized. In some embodiments, the PMD layer and the interfacial dielectric are subjected to chemical mechanical planarization (CMP) until a top surface of the gate electrode is exposed. The PMD layer and the interfacial dielectric may be over-polished to sufficiently expose the gate electrode.

In operation 340, one or more vias may be formed through the PMD layer over the source and drain regions of the substrate. Vias may be formed in the PMD layer using methods known in the art, such as etching, photolithography, laser drilling, sandblasting, and the like.

Figure 4C:
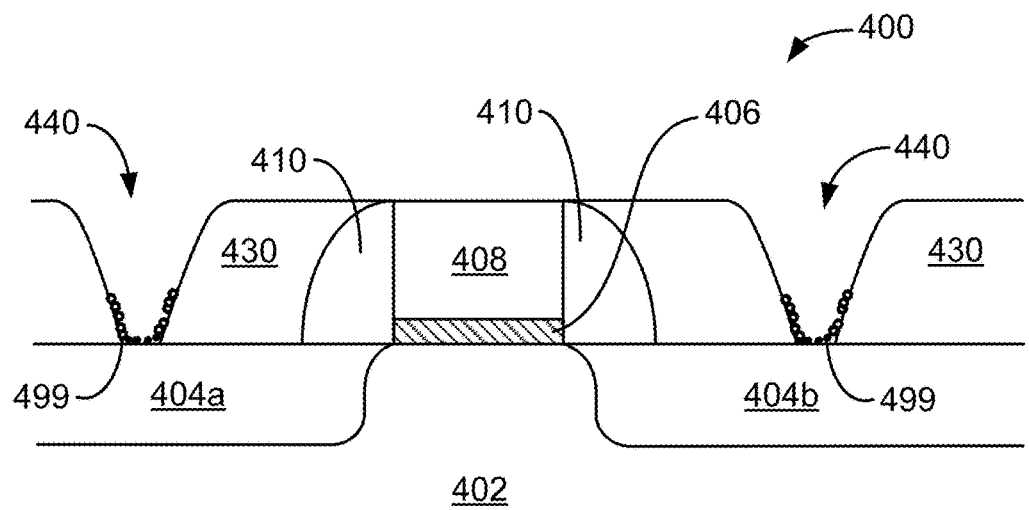

FIG. 4C shows an example of a cross-section schematic view of the partially fabricated interconnect structure of the semiconductor device 400. In FIG. 4C, the semiconductor device 400 has the top surface of the gate electrode exposed after polishing and/or planarizing the PMD layer 430. Additionally, at least two vias 440 are formed through the PMD layer 430 to expose a top surface of the source and drain regions 404a and 404b respectively. Note that after this operation, there may be residues 499 on the surface at or near the bottom of vias 440 as shown.

The vias 440 are formed over the source and drain regions 404a and 404b of the substrate 402. The vias 440 may be formed through the PMD layer 430 having various shapes and sizes. In some implementations, the vias 440 may have a tapered sidewall contour or a linear sidewall contour. In some implementations, the vias 440 may have a height to width aspect ratio of about 3:1 or greater.

The vias 440 are formed through the PMD layer 430. In some embodiments, an interfacial dielectric (not shown) serves as an etch stop layer. Instead of depositing a separate etch stop layer over the substrate 402 or using the substrate 402 itself as an etch stop, an interfacial dielectric (not shown) may function as an etch stop during formation of the vias 440 since many dielectric materials typically have highly selective etch chemistries.

Returning to FIG. 3, in operation 350, the substrate may be cleaned or pre-cleaned to remove oxides and organic residues from the surfaces of the substrate. In various embodiments, the substrate may be wet cleaned by exposing the substrate to hydrofluoric acid. In various embodiments, cleaning the substrate can result in source and drain regions having depleted amounts of dopant. Conventional techniques are also incapable of replenishing dopants in source and drain regions, particularly in high aspect ratio features. In some embodiments, this operation may be performed in an environmentally closed chamber (ECC) such as in a single wafer cleaning chamber. Such a chamber may be attached to an apparatus or tool having one or more stations such that a wafer being processed in various operations as described herein may be transferred from station to station in vacuum or without air break. In various embodiments, this operation is performed to remove oxides and other residues such that the source and drain regions include semiconductor or doped semiconductor material.

Figure 4D:
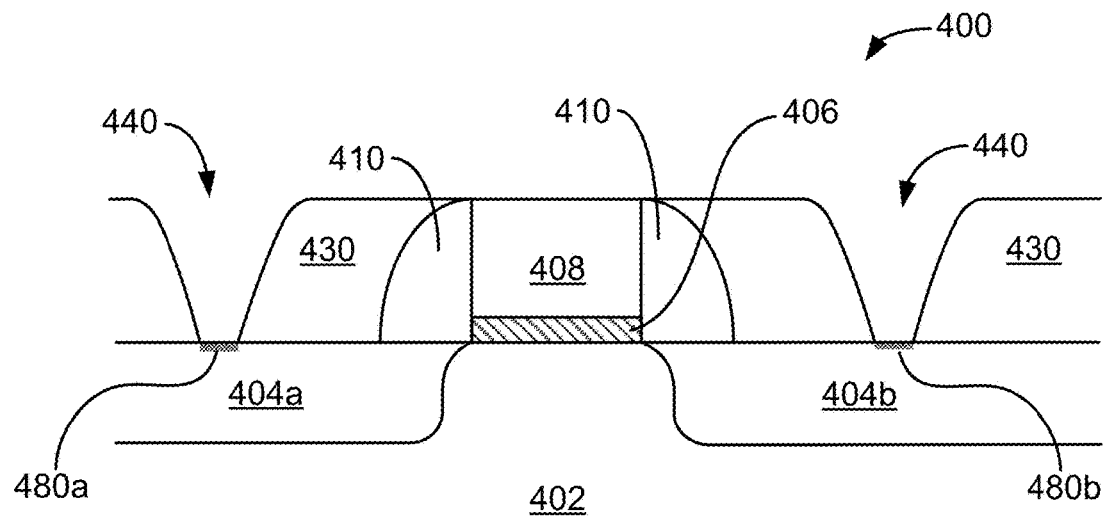

FIG. 4D shows an example of a cross-section schematic view of the partially fabricated interconnect structure of the semiconductor device 400. In FIG. 4D, the residue 499 from FIG. 4C has been cleaned. However, as a result, the depleted source and drain regions 480a and 480b respectively result in higher resistance at the interface.

Returning to FIG. 3, in operation 380, a metal is deposited over the substrate. In some implementations, the metal can be deposited over the interfacial dielectric by CVD. The deposition of the metal over the substrate at least partially fills the one or more vias to form an electrical contact. In some embodiments, the deposition of the metal substantially fills the one or more vias to form the electrical contact. The electrical contact may be part of an interconnect structure that connects the transistor device with other devices in an integrated circuit.

In some implementations, prior to depositing the metal, additional layers may be deposited over the interfacial dielectric. Such layers may include barrier, nucleation, and/or seed layers. Each of these layers may be formed using a conventional deposition method known in the art, such as CVD, and may each serve multiple functions. In some embodiments, the barrier layer may limit the diffusion of metal atoms into the interfacial dielectric and the PMD layer. In some embodiments, the adhesive layer may serve to promote the adhesion of metal onto the interfacial dielectric. In some embodiments, the nucleation layer may promote the nucleation of bulk metal on the substrate.

The thickness of the adhesive, barrier, or nucleation layer may be relatively thin, such as less than about 500 Å. Materials for the adhesive, barrier, or nucleation layer can include but is not limited to ruthenium (Ru), rhodium (Rh), Pd, Ni, Co, Pt, Ti, Ta, W, titanium nitride (TiN), tantalum nitride (TaN), tungsten nitride (WN), zirconium (Zr), and hafnium (Hf). For example, a barrier layer over the interfacial dielectric can include TiN or WN. In some embodiments, the adhesive, barrier, or nucleation layer can include multiple layers of materials, such as combinations of some of the materials listed above.

Figure 4E:
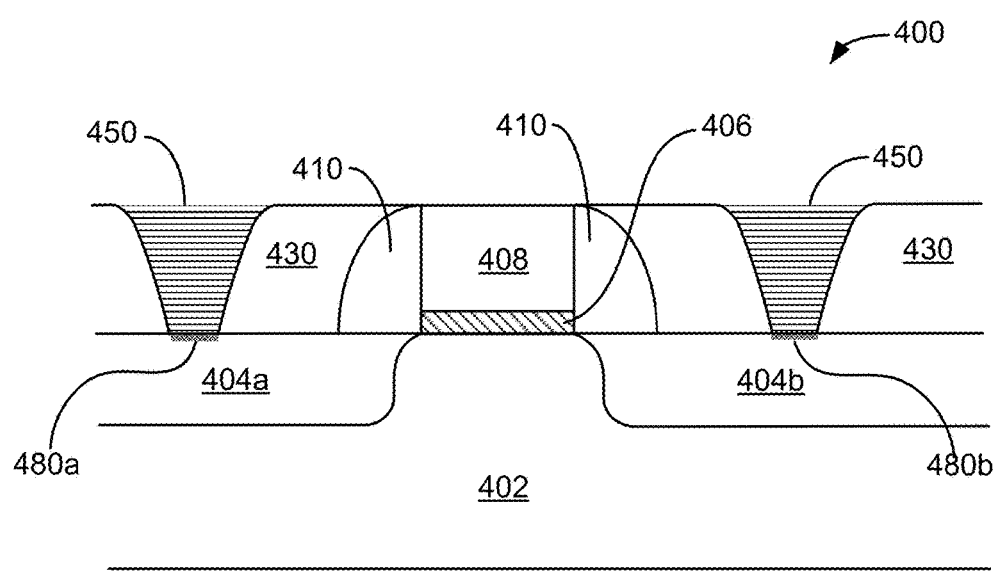

In FIG. 4E, a metal 450 is deposited over the interfacial dielectric 420 and substantially fills the vias 440. The thickness of the metal 450 can be deposited to substantially or completely fill each of the vias 440. The metal 450 can include various metals, such as copper (Cu), magnesium (Mg), aluminum (Al), W, Ru, Pd, Co, Ni, Ti, Ta, TiN, TaN, Hf, and Zr. The deposition of metal may be followed by a polishing or planarizing process to remove any excess metal.

In some implementations, the metal 450 includes W and forms a tungsten plug as an electrical contact. Formation of a tungsten plug may provide a low resistivity electrical contact. In some instances, the tungsten plug may be formed by depositing a thin barrier layer of WN, and then depositing bulk W to fill the via 440. The thin barrier layer of WN may be deposited using a pulsed nucleation layer (PNL) technique, and the bulk W may be deposited using CVD or a combination of PNL deposition and CVD. A description of depositing WN by a PNL process is described in U.S. Pat. No. 7,005,372, which is herein incorporated by reference for describing deposition of WN by PNL. In some instances, the tungsten plug may be formed by depositing bulk W into the via 440 without a nucleation layer. A description of depositing bulk W by CVD without a nucleation layer is described in U.S. Pat. No. 8,975,184, which is herein incorporated by reference for describing deposition of bulk W by CVD. In some instances, the W plug can be formed using a deposition-etch-deposition process to at least substantially fill the via 440 with W. A description of such a technique is described in U.S. Pat. No. 9,034,768, which is herein incorporated by reference for describing deposition-etch-deposition processes.

However, it is noted that as shown, because of the depleted dopant regions 480a and 480b, the interface between the source region 404a and the metal contact 450 over the source region 404a, and between the drain region 404b and the metal contact 450 over the drain region 404b have higher carrier resistance, and the effect of doping these regions previously to reduce carrier resistance is thus reduced.

Provided herein are methods of doping semiconductor material using a rare earth metal source at low temperature. Disclosed embodiments may be used to replenish dopants in high aspect ratio features. Disclosed embodiments are suitable for doping source and/or drain regions of an NMOS structure, for example, and involve a plasma-assisted surface-activated doping technique using conformal deposition of a thin rare earth metal-containing film and annealing techniques at temperatures less than about 500° C.

Figure 5:
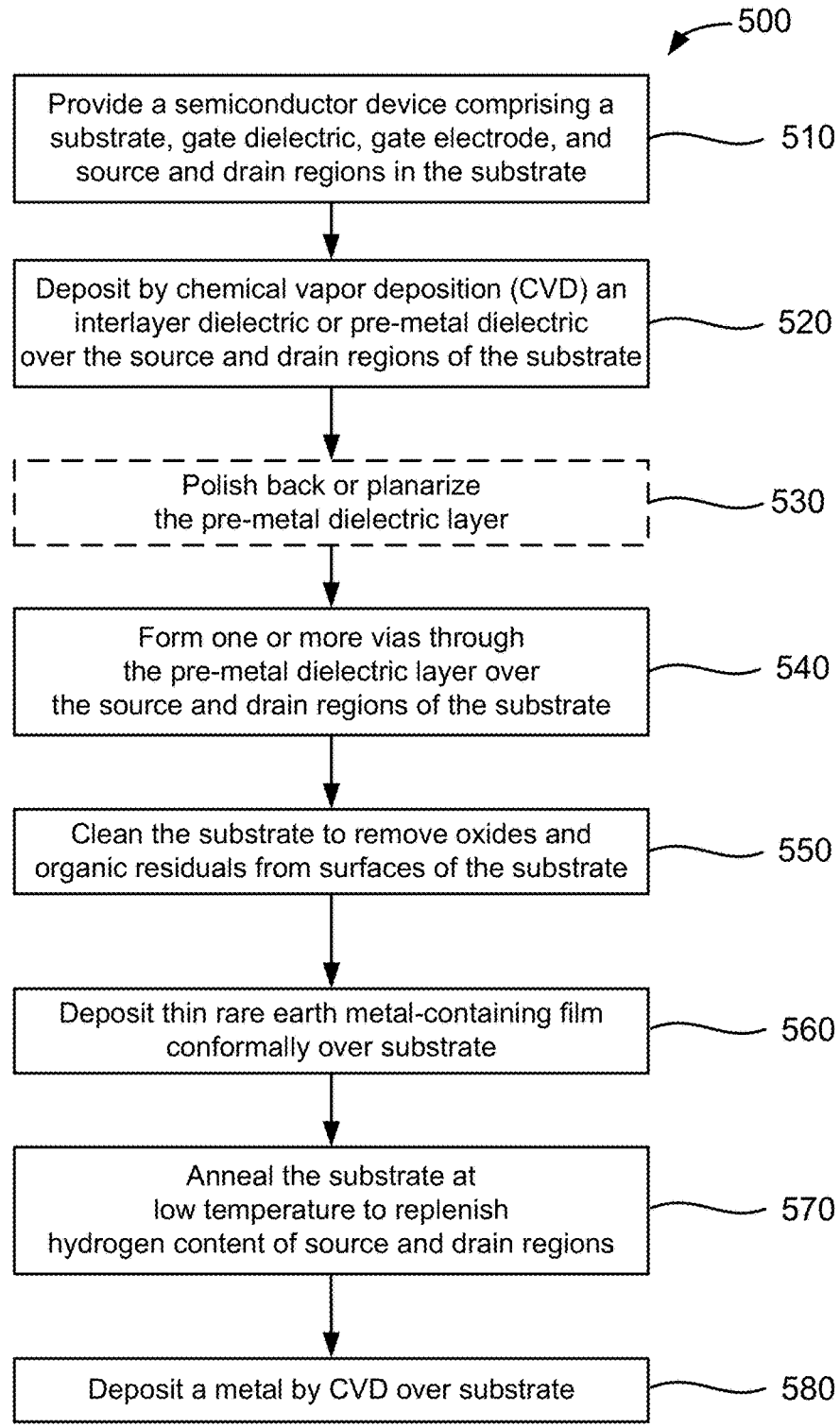
FIG. 5 shows a process flow diagram illustrating a method of manufacturing an interconnect structure of a semiconductor device in accordance with certain disclosed embodiments.
Figure 6A:
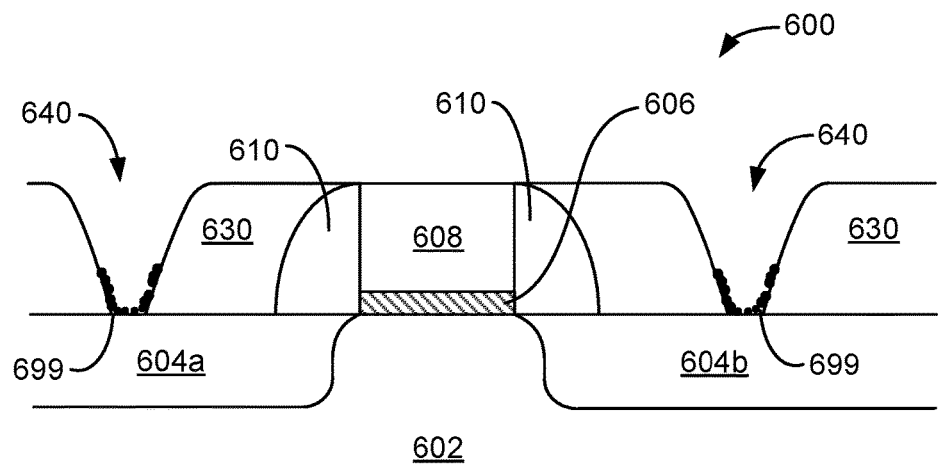
FIG. 6A-6E show cross-section schematic views of various stages in a method of manufacturing an interconnect structure of a semiconductor device in accordance with certain disclosed embodiments.

FIG. 5 is a process flow diagram depicting operations that may be performed in accordance with certain disclosed embodiments. Note that descriptions made above with respect to process 300 in FIG. 3 may be relevant to one or more operations of process 500 in FIG. 5. For example, operation 510 may correspond to operation 310, operation 520 may correspond to operation 320, operation 530 may correspond to operation 330, operation 540 may correspond to operation 340, operation 550 may correspond to operation 350, and operation 580 may correspond to 380. Operations 560 and 570 are therefore described in detail below with respect to FIG. 6A-6D. For purposes of describing certain embodiments herein, it will be understood that FIG. 6A is an example of a cross-section schematic view of the partially fabricated interconnect structure of the semiconductor device 600, which corresponds to the partially fabricated interconnect structure of the semiconductor device 400 in FIG. 4C. It will be understood that in FIG. 6A, operations 510-540 of FIG. 5 have been performed. Residue 699 of FIG. 6A is shown in vias 640 of semiconductor device 600, for which there is a fabricated gate dielectric 606 over substrate 602, and a gate electrode 608 over gate dielectric 606. Source and drain regions 604a and 604b were formed in the substrate 602 and laterally on opposite sides of the gate dielectric 606. Source and drain regions 604a and 604b respectively may have been doped in prior operations. Spacers 610 were formed on laterally opposite sides of the gate dielectric 606 and over substrate 602. In various embodiments, the vias 640 may have a feature opening less than about 10 nm.

As described above, while FIG. 6A shows an example of a certain type of transistor, it will be understood that disclosed embodiments and the descriptions provided herein may also apply to other types of semiconductor devices, such as a FinFET structure. For example, the structure in FIG. 6A may correspond to a FinFET structure such as that depicted in FIG. 2. Source regions 214a and 204a may correspond to source region 604a of FIG. 6A, and drain regions 214b and 204b may correspond to drain region 604b of FIG. 6A.

Figure 6B:
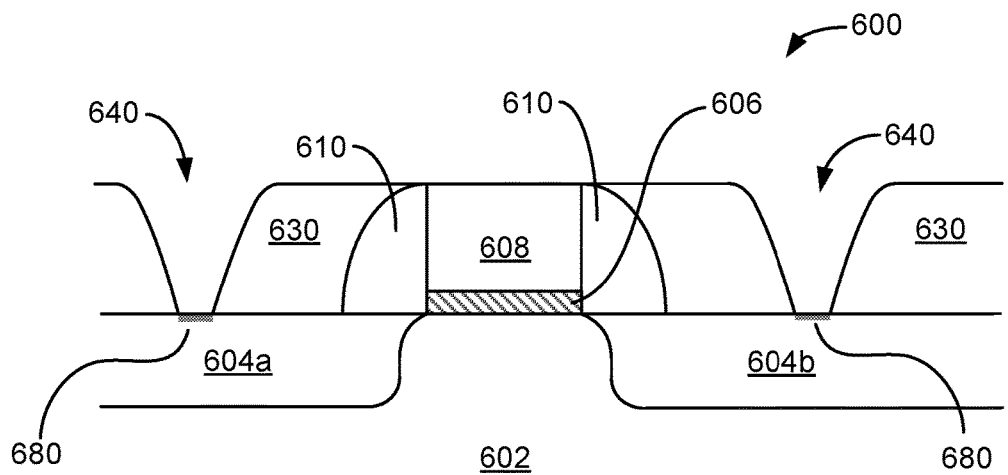

In operation 550, the substrate is cleaned to remove oxides and organic residuals from surfaces of the substrate. Process conditions and apparatuses described above with respect to operation 350 may be used for this operation. In FIG. 6B, the substrate has been cleaned to remove residue 699, leaving depleted regions 680 at the surface of the source and drain regions 604a and 604b respectively. Operation 550 may also be performed for a FinFET structure to remove oxides and organic residuals from the surfaces of the substrate. For a FinFET structure such as FinFET structure 200 of FIG. 2, the substrate may be cleaned to remove oxides and organic residuals from the surfaces of the source regions 214a and 204a as well as drain regions 214b and 204b, leaving depleted regions at these surfaces.

Returning to FIG. 5, in operation 560, a thin rare earth metal-containing film may be deposited conformally over the substrate. In various embodiments, the rare earth metal-containing film may be deposited over source and drain regions of a transistor. The rare earth metal may include yttrium in some embodiments. For example, in some embodiments, operation 560 may deposit a $C_xH_y$—Y film where x and y are integers. For example, x may be 2, and y may be 5, such that a $C_2H_5$—Y film is deposited. In some embodiments, a solid source such as $YF_3$, $YI_3$, or $YCl_3$ may be used to deposit a yttrium-containing film over the substrate as further described below.

The rare earth metal-containing film may be deposited to a thickness between about 2 nm and about 5 nm, for example about 2 nm.

In various embodiments, the film may be deposited using one or more reactants, such as a rare earth metal source or a rare earth metal-containing precursor, and igniting a plasma. The plasma may be an in-situ or a remote plasma. During operation 560, a film is deposited over the substrate without applying a bias. In some embodiments, the rare earth metal-containing precursor may be introduced to the substrate as a gas without a plasma. In some embodiments, the rare earth metal-containing precursor may be ignited to generate a plasma and the plasma may be introduced with an inert gas such as helium to the substrate to deposit the rare earth metal-containing film. In some embodiments, using a plasma may deposit a thicker film.

In some embodiments, the film may be deposited by plasma-enhanced CVD. In some embodiments, the film may be deposited by plasma-enhanced atomic layer deposition (PEALD). For example, alternating pulses of the precursor and a plasma reactant may be delivered to the chamber to deposit the film by PEALD.

The precursor may be selected such that large rare earth metal atoms are present in the precursor to be used as dopants on the semiconductor material. In various embodiments, the rare earth metal chosen may be selected such that the size of an atom of the rare earth metal is similar to the size of an atom of the semiconductor material. For example, in some embodiments, where the conformal thin rare earth metal-containing film is deposited over a silicon substrate, yttrium may be selected because yttrium and silicon are similar in size.

In some embodiments, a lower vapor pressure rare earth metal-containing precursor may be selected to ease handling of the precursor. For example, in some embodiments, the boiling point may be between about 60° C. and about 300° C.

In various embodiments, the rare earth metal-containing precursor may be a gas or a liquid. For example, for a yttrium-containing film, the precursor may be any of tris (butylcyclopentadienyl)yttrium(III) ($Y(C_5H_4CH_2(CH_2)_2CH_3)_3$), tris(cyclopentadienyl)yttrium(III) ($Y(C_5H_5)_3$), tris[N,N-bis(trimethylsilyl)amide]yttrium ($[[(CH_3)_3Si]_2N]_3Y$), or combinations thereof. The melting point of a yttrium-containing precursor may be between about 60° C. and about 300° C. for certain embodiments.

In some embodiments, the rare earth metal-containing precursor may be a solid, such as yttrium(III) fluoride, yttrium(III) iodide, yttrium(III) chloride, and combinations thereof. Where a solid source is selected, the solid source may be delivered to a high temperature solid source evaporator where the solid is heated to a temperature greater than about 900° C. to generate a precursor that may be delivered to the substrate.

In various embodiments, operation 560 may be performed at a chamber pressure between about 5 mTorr and about 300 mTorr. Operation 560 may be performed for a duration between about 5 seconds and about 120 seconds. Longer deposition duration may result in deeper diffusion of a rare earth metal into the semiconductor material.

Figure 6C:
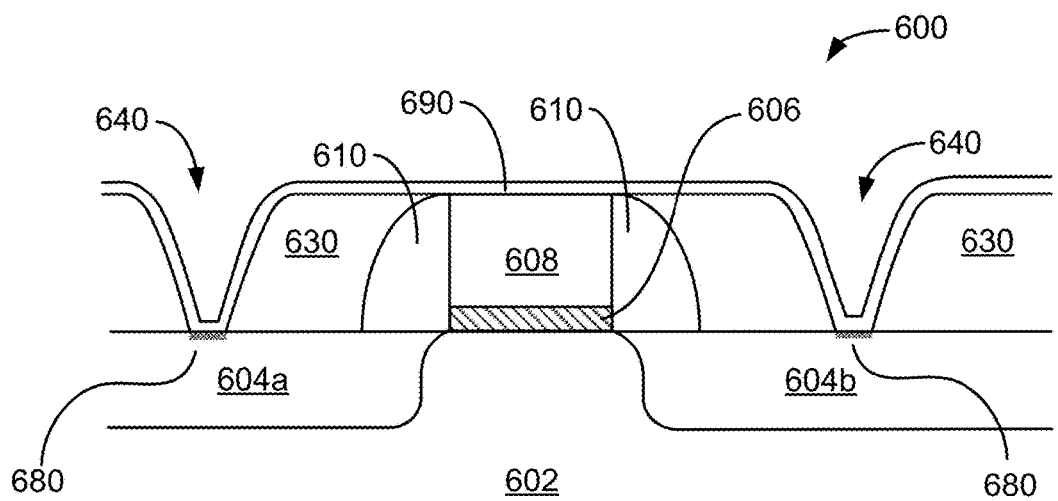

FIG. 6C shows an example of a cross-section schematic view of the partially fabricated interconnect structure of the semiconductor device 600 with a conformal rare earth metal-containing film 690 deposited conformally over the substrate. Note that the film is deposited conformality in vias 640. In a FinFET structure, such as that depicted in FIG. 2, a conformal rare earth metal containing film may be deposited conformally such that it is deposited over source regions 214a and 204a, and drain regions 214b and 204b.

Returning to FIG. 5, in operation 570, the substrate is annealed at a low temperature to replenish the dopants such as hydrogen content of the source and drain regions. During the anneal, the pedestal holding the substrate may be heated to a temperature less than about 500° C., such as a temperature of about 400° C., about 450° C., or about 500° C. In various embodiments, operation 570 may be performed by rapid thermal processing (RTP) using a rapid thermal anneal. The substrate may be annealed for a duration between about 5 seconds and about 180 seconds.

Without being bound by a particular theory, it is believed that while a plasma is used to deposit the rare earth metal-containing film, such as, for example and for purposes of illustration for this example, yttrium-containing film, the deposition process does not result in incorporation of yttrium. Rather, the yttrium is not activated until the deposited film is annealed. This is distinct from conventional doping processes.

A semiconductor wafer, such as a silicon wafer, is a single crystal and silicon atoms are arranged in an orderly lattice structure. For a conventional n-type dopant, such as arsenic, the dopant is only capable of affecting the conductivity of the silicon lattice when it is in a specified position. For purposes of illustration, the chemical valence of silicon is 4 and the valence of arsenic is 5. If a silicon atom is removed from its place in the lattice, an arsenic atom can be substituted into that position ("substitutional"), thereby contributing to the electrical conductivity of the overall silicon (and now doped) lattice. However, if arsenic is located in an "interstitial" location between sites of silicon lattice atoms, the arsenic atom is not electrically active and is unable to affect the electrical conductivity. At higher temperatures, more silicon atoms obtain enough thermal energy to move into and out of their lattice sites, thereby allowing a dopant such as arsenic the statistical opportunity to substitute those positions. Thermally annealing a substrate that is doped with arsenic for a certain amount of time at a certain temperature can diffuse arsenic deep into the silicon lattice, producing a high doping concentration of arsenic in the surface of the silicon. However, the fraction of arsenic that is electrically active and located in the substitutional lattice sites may be very small. While conventional techniques for implanting dopants exist, as described above, implanting may cause damage that is later repaired to achieve the desired electrical performance of the device.

In contrast, it is believed that disclosed embodiments do not encounter the problems associated with conventional n-type dopants. Here, the deposited film is annealed at a temperature high enough to sufficiently move the semiconductor material to allow the rare earth metal atom to be in the correct positions, but for a time short enough such that the dopant is concentrated at or near the surface (e.g., shallow doping). For example, the rare earth metal dopant may only be doped about 5 to about 20 nm into the surface of the semiconductor material. As a result, disclosed embodiments result in electrically activated dopants that are incorporated into semiconductor material using a short amount of time and a high enough temperature such that the dopants affect the electrical conductivity of the semiconductor material.

Figure 6D:
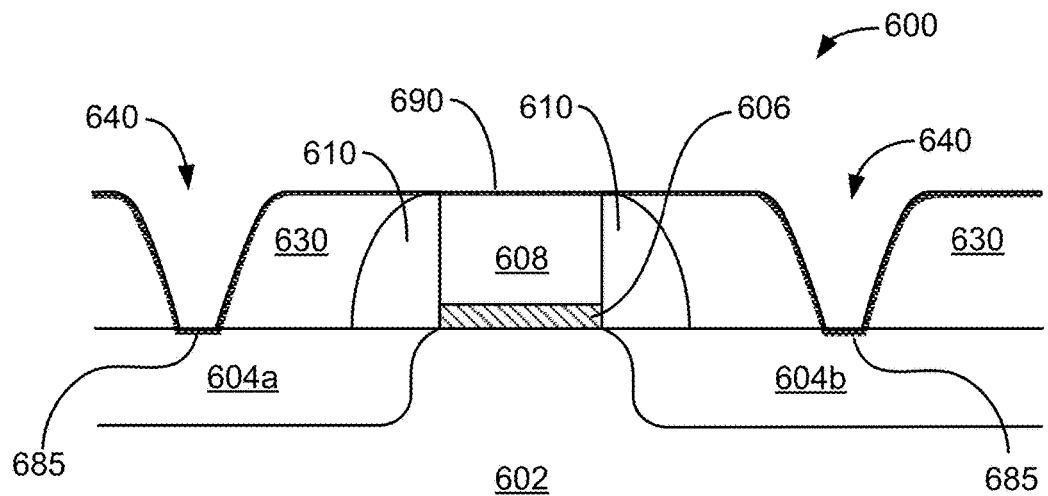

FIG. 6D shows an example of a cross-section schematic view of the partially fabricated interconnect structure of the semiconductor device 600 where the device 600 has been annealed to form a rare earth metal-doped surface at 685 on the source and drain regions 604a and 604b. For a FinFET structure, such as that shown in FIG. 2, the rare earth metal-doped surface may be formed at the surfaces of source regions 214a and 204a and/or drain regions 214b and 204b to replenish the dopants. These regions may now exhibit reduced contact resistance when an interconnect or contact is formed over them.

The depleted regions 680 from FIGS. 6B and 6C have been replenished such that doped regions 685 on the source and drain regions 604a and 604b may now exhibit reduced resistance for a contact or interconnect.

Figure 6E:
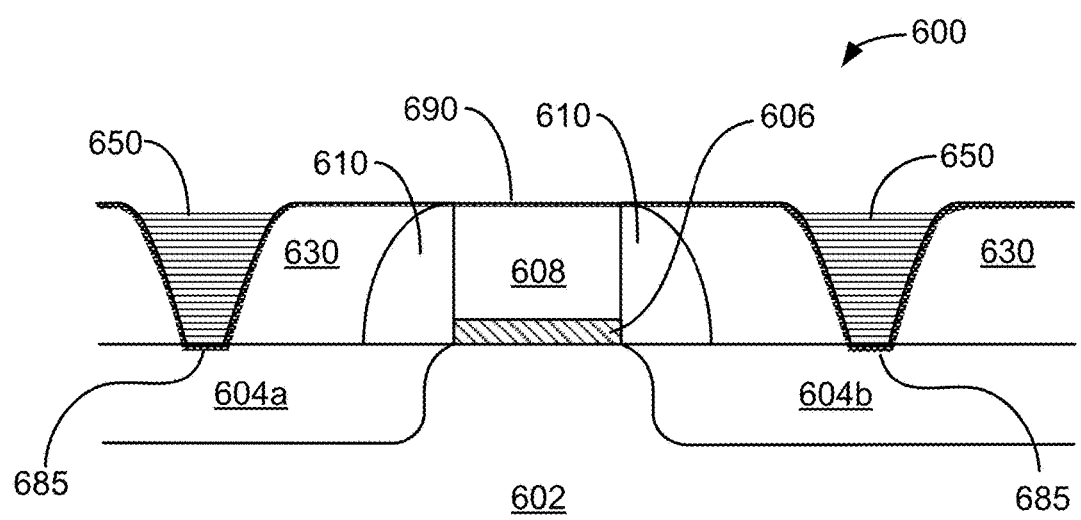

Returning to FIG. 5, in operation 580, metal is deposited by CVD over the substrate. Operation 580 may correspond to operation 380 of FIG. 3 such that any of the metals described with respect to operation 380 may be deposited in operation 580 using similar techniques and process conditions. FIG. 6E shows an example of a cross-section schematic view of the partially fabricated interconnect structure of the semiconductor device 600 where metal 650 has filled the vias. For a FinFET structure, such as FinFET structure 200 of FIG. 2, a metal may be deposited in vias (not shown) over source regions 214a and 204a as well as drain regions 214b and 204b to form interconnects.

Apparatus

As described herein, in various embodiments, substrates may be cleaned or pre-cleaned prior to processing in accordance with disclosed embodiments. Substrates may be cleaned or pre-cleaned using any suitable tool or apparatus. In some embodiments, substrates may be cleaned in a single wafer chamber, such as an Environmentally Closed Chamber (ECC) as described herein.

Figure 7A:
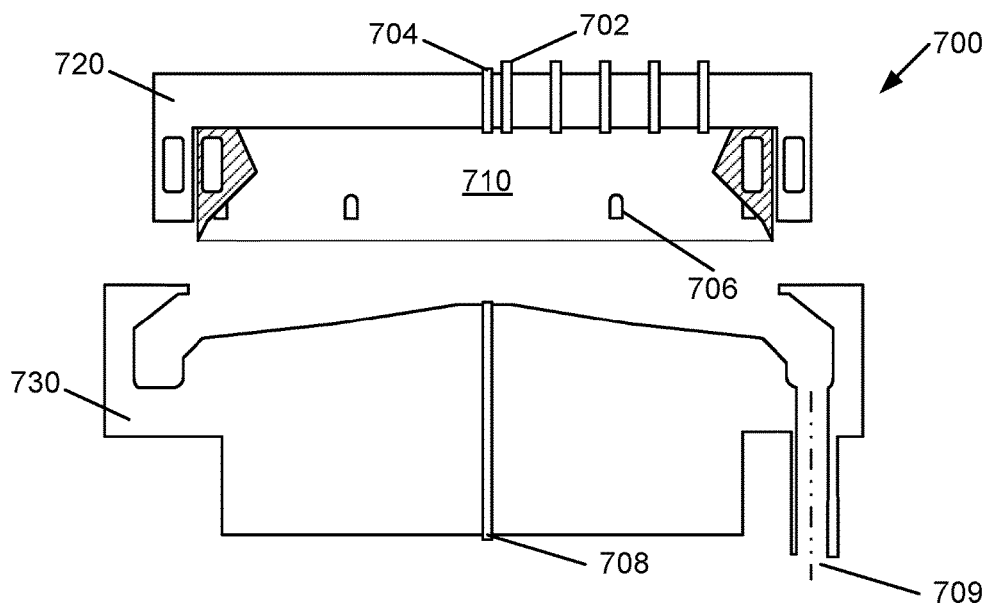
FIG. 7A-7C show schematic views of a single wafer chamber that may be used to clean a substrate.

FIG. 7A is a schematic view of a single wafer chamber 700 that may be used to clean a substrate. Such a chamber may be used using various operations that are described herein with respect to FIG. 7A-7C. It will be understood that apparatuses other than the examples provided in FIG. 7A-7C may be used to clean a substrate in various embodiments. Further descriptions and examples of suitable chambers and components of such chambers may be found in U.S. Pat. Nos. 8,490,634; 8,485,204; 8,709,165; and U.S. Patent Application No. 2013/0062839, which are herein incorporated by reference in their entireties.

FIG. 7A shows a chamber 700 including an upper chamber component 720 and a lower chamber component 730. In various embodiments, the lower chamber component 730 may be a media bowl. The upper chamber component 720 includes inlets 702 as well as an inlet 704 which may be used to deliver gas, such as nitrogen gas. Within upper chamber component 720 is a processing region 710, which a substrate (not shown) may be processed. A substrate (not shown) may be held by wafer pins 706. The lower chamber component 730 includes a gas inlet or outlet 708 and a vacuum outlet 709 which may be used to expunge gases from the chamber 700. The lower chamber component 730 is capable of moving laterally to open and close the chamber 700 to insert and remove wafers (not shown).

Figure 7B:
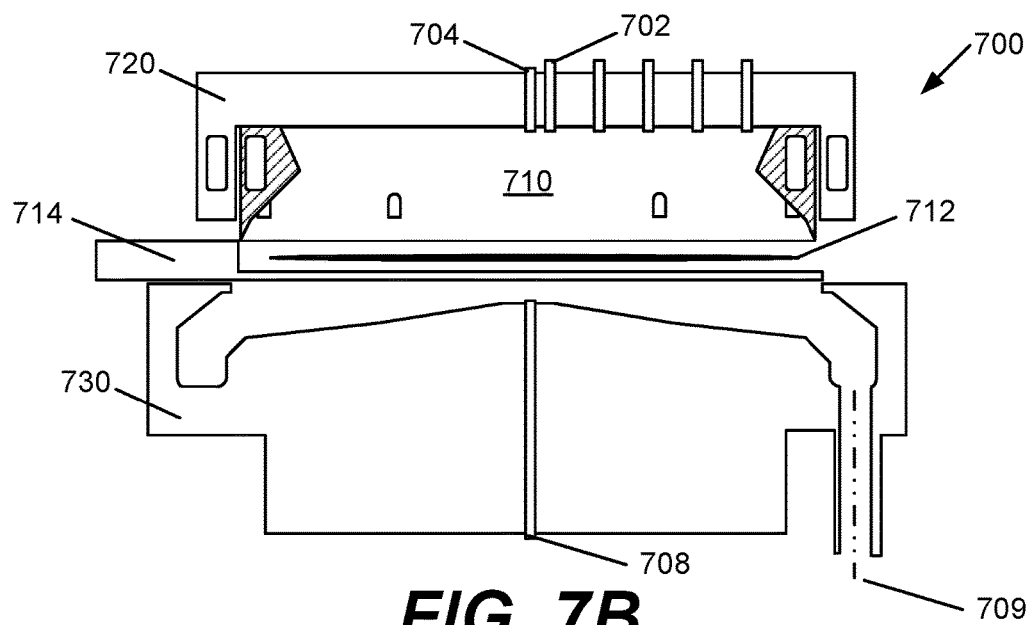

FIG. 7B shows an example schematic illustration of chamber 700 whereby a wafer is prepared to be loaded into the chamber 700. To load a wafer, a load door (not shown) of the chamber 700 opens such that the lower chamber component 730 may be lowered.

Figure 7C:
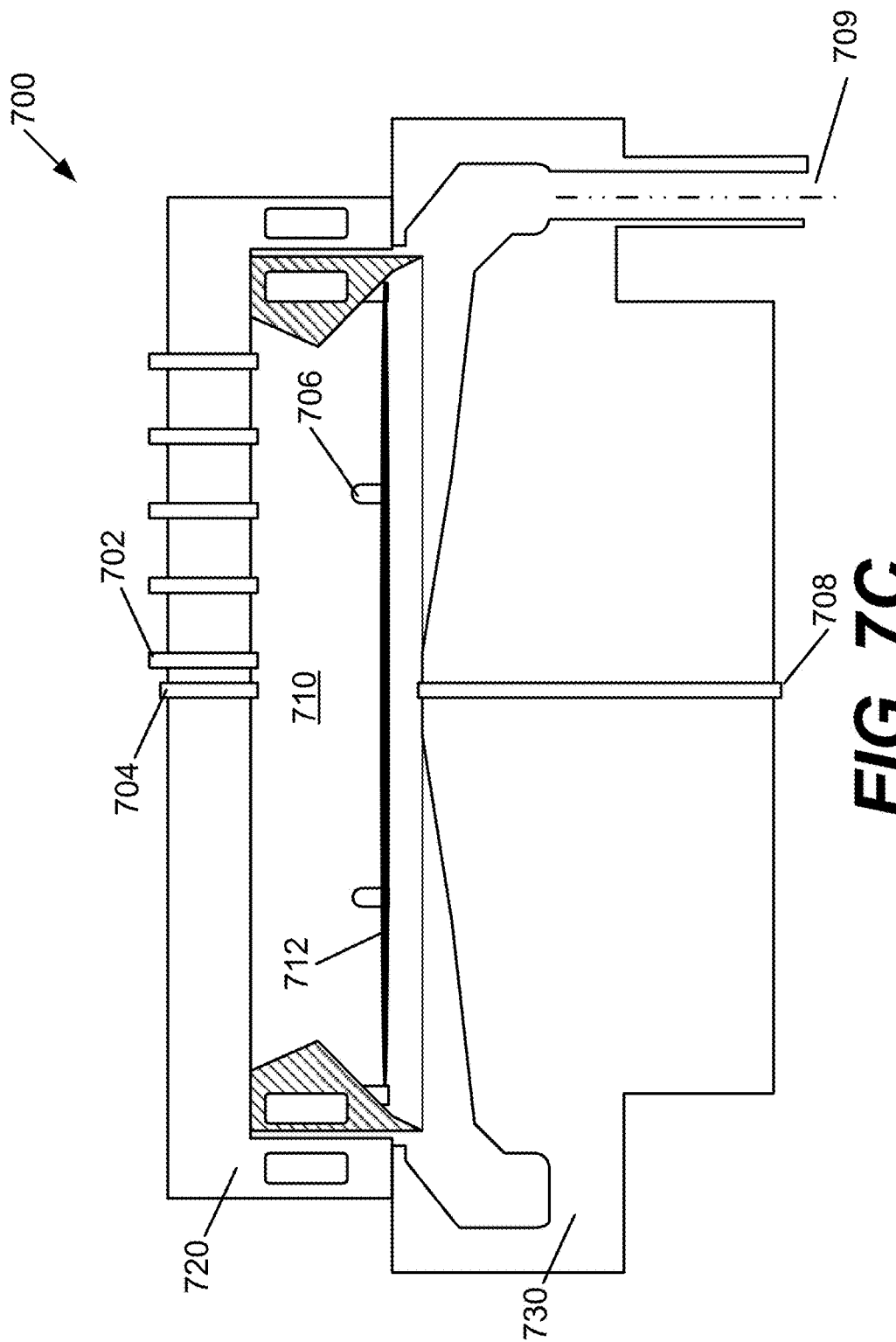

After the wafer is inserted into the chamber 700, robot 714, which carries the wafer from outside of chamber 700, moves the wafer 712 into the chamber and lifts the wafer 712 into the processing region 710 where the chuck engages pins 706 to hold the wafer 712 as shown in FIG. 7C.

Figure 9:
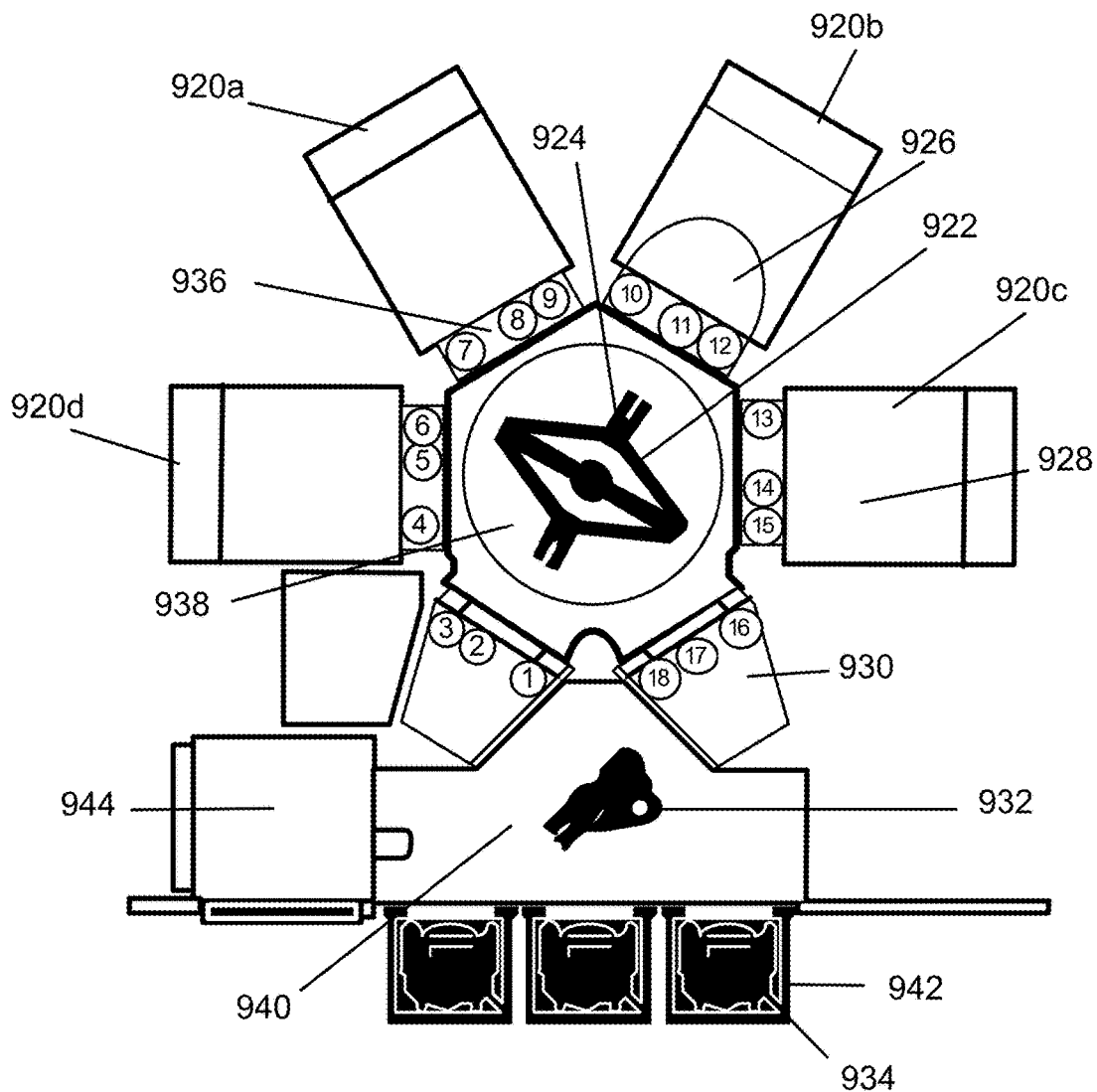
FIG. 9 shows a top view schematic of a processing system for manufacturing an interconnect structure of a semiconductor device.

In various embodiments, the chuck is a levitating chuck supporting rotational speeds of 0 to 2000 rpm and is magnetically driven. The chamber 700 is hermetically sealed when in the closed position and includes multiple nozzles (inlets 702 and 704) to dispense chemistry into the chamber 700. In various embodiments, the chamber 700 allows for a small volume of gas or liquid to be used in the chamber. A chamber 700 used to pre-clean the substrate may also be used as a station attached to a larger apparatus or tool. An example apparatus or tool is shown in FIG. 9 and is described in further detail below.

Disclosed embodiments for depositing a conformal rare earth metal-containing film on a substrate and annealing the substrate to replenish dopants in semiconductor material may be performed in any suitable chamber or apparatus. One example chamber is provided in FIG. 8.

Figure 8:
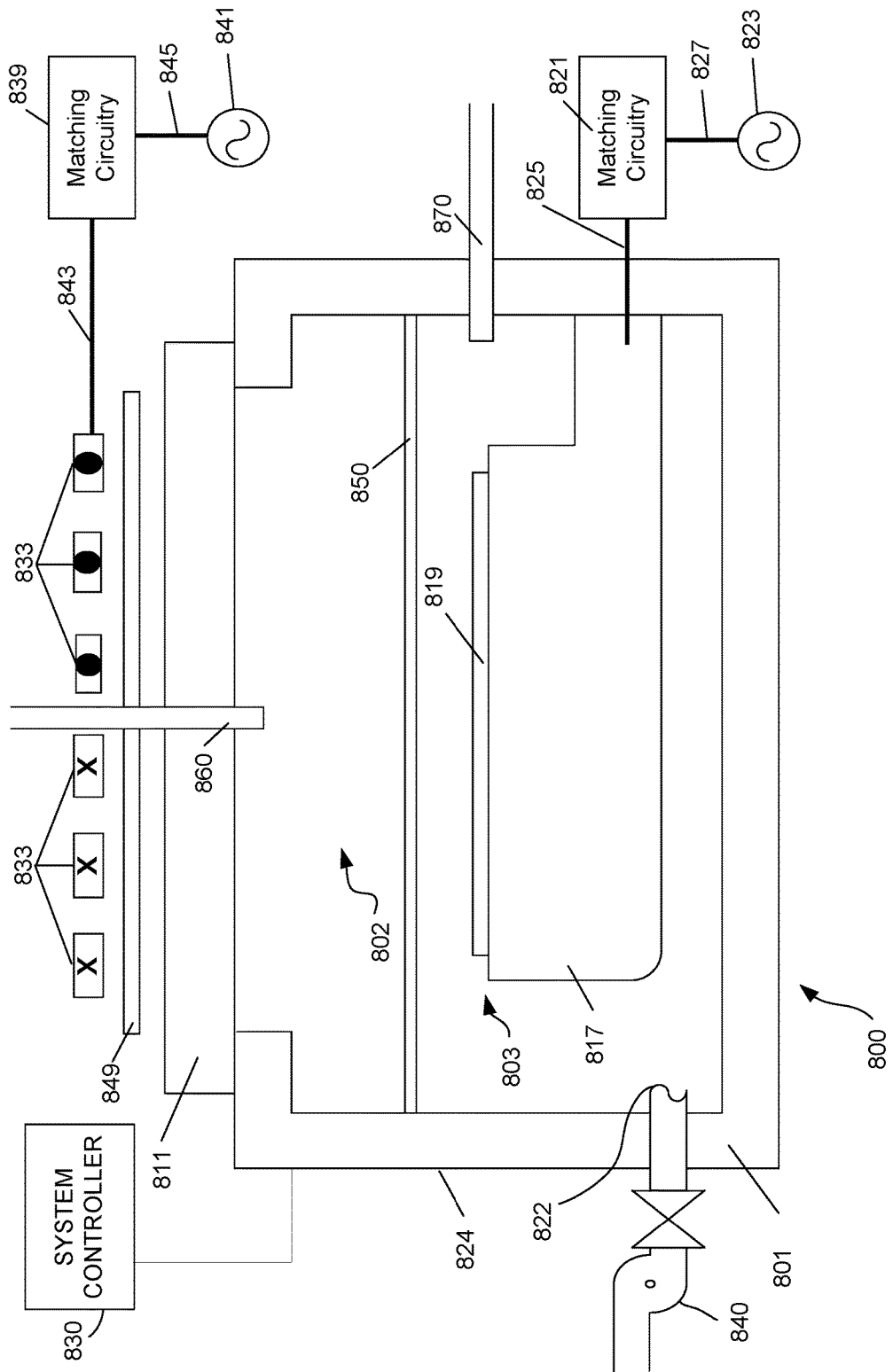
FIG. 8 is a schematic diagram of an example process chamber for performing disclosed embodiments.

FIG. 8 schematically shows a cross-sectional view of an inductively coupled plasma apparatus 800 in accordance with certain embodiments herein. A Kiyo™ reactor, produced by Lam Research Corp. of Fremont, Calif., is an example of a suitable reactor that may be used to implement the techniques described herein. The inductively coupled plasma apparatus 800 includes process chamber 824 structurally defined by chamber walls 801 and a window 811. The chamber walls 801 may be fabricated from stainless steel or aluminum. The window 811 may be fabricated from quartz or other dielectric material. An optional internal plasma grid 850 divides the process chamber 824 into an upper sub-chamber 802 and a lower sub-chamber 803. In most embodiments, plasma grid 850 may be removed, thereby utilizing a chamber space made of sub-chambers 802 and 803. A chuck 817 is positioned within the lower sub-chamber 803 near the bottom inner surface. The chuck 817 is configured to receive and hold a semiconductor wafer 819 upon which the process is performed. The chuck 817 can be an electrostatic chuck for supporting the wafer 819 when present. The chuck 817 may be a heater such that it may heat a substrate to a temperature less than about 500° C. to anneal a substrate in some embodiments. In some embodiments, an edge ring (not shown) surrounds chuck 817, and has an upper surface that is approximately planar with a top surface of a wafer 819, when present over chuck 817. The chuck 817 also includes electrostatic electrodes for chucking and dechucking the wafer. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817.

A coil 833 is positioned above window 811. The coil 833 is fabricated from an electrically conductive material and includes at least one complete turn. The exemplary coil 833 shown in FIG. 8 includes three turns. The cross-sections of coil 833 are shown with symbols, and coils having an "X" extend rotationally into the page, while coils having a "●" extend rotationally out of the page. An RF power supply 841 is configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 is maintained in a spaced apart relationship relative to the coil 833. The Faraday shield 849 is disposed immediately above the window 811. The coil 833, the Faraday shield 849, and the window 811 are each configured to be substantially parallel to one another. The Faraday shield may prevent metal or other species from depositing on the dielectric window of the process chamber 824.

Process gases may be supplied through a main injection port 860 positioned in the upper chamber and/or through a side injection port 870, sometimes referred to as an STG. Process gases may include vaporized liquid precursors or vaporized solid precursors, which may be vaporized in a solid source evaporator (not shown) upstream of the apparatus 800. A vacuum pump 840, e.g., a one or two stage mechanical dry pump and/or turbomolecular pump, may be used to draw process gases out of the process chamber 824 and to maintain a pressure within the process chamber 824 by using a closed-loop-controlled flow restriction device, such as a throttle valve (not shown) or a pendulum valve (not shown), during operational plasma processing.

During operation of the apparatus, one or more reactant gases may be supplied through injection ports 860 and/or 870. In certain embodiments, gas may be supplied only through the main injection port 860, or only through the side injection port 870. In some cases, the injection ports may be replaced by showerheads. The Faraday shield 849 and/or optional grid 850 may include internal channels and holes that allow delivery of process gases to the process chamber 824. Either or both of Faraday shield 849 and optional grid 850 may serve as a showerhead for delivery of process gases.

Radio frequency power is supplied from the RF power supply 841 to the coil 833 to cause an RF current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 deposit a conformal rare earth metal-containing film on the wafer.

If the plasma grid is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850 limits the amount of hot electrons in the lower sub-chamber 803. In some embodiments, the apparatus is designed and operated such that the plasma present in the lower sub-chamber 803 is an ion-ion plasma.

Both the upper electron-ion plasma and the lower ion-ion plasma may contain positive and negative ions, though the ion-ion plasma will have a greater ratio of negative ions to positive ions. Volatile byproducts may be removed from the lower sub-chamber 803 through port 822.

The chuck 817 disclosed herein may operate at elevated temperatures ranging between about 30° C. and about 500° C. The temperature will depend on the process operation and specific recipe. In some embodiments, the process chamber 824 may also operate at pressures in the range of between about 1 mTorr and about 300 mTorr.

Process chamber 824 may be coupled to facilities (not shown) when installed in a clean room or a fabrication facility. Facilities include plumbing that provide processing gases, vacuum, temperature control, and environmental particle control. These facilities are coupled to process chamber 824, when installed in the target fabrication facility. Additionally, process chamber 824 may be coupled to a transfer chamber that allows robotics to transfer semiconductor wafers into and out of process chamber 824 using typical automation.

In some embodiments, a system controller 830 (which may include one or more physical or logical controllers) controls some or all of the operations of a chamber. The system controller 830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller 830 or they may be provided over a network. In certain embodiments, the system controller 830 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the wafer (which in various embodiments may be 0), the frequency and power applied to coils or other plasma generation components, wafer position, wafer movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable computer readable programming language.

In some embodiments, system control software includes input/output control (IOC) sequencing instructions for controlling the various parameters described above. For example, each phase of a semiconductor fabrication process may include one or more instructions for execution by the system controller 830. The instructions for setting process conditions for a phase may be included in a corresponding recipe phase, for example. In some embodiments, the recipe phases may be sequentially arranged, such that steps in a doping process are executed in a certain order for that process phase.

Other computer software and/or programs may be employed in some embodiments. Examples of programs or sections of programs for this purpose include wafer positioning program, a process gas composition control program, a pressure control program, a heater control program, and an RF power supply control program.

In some cases, the controller 830 controls gas concentration, wafer movement, and/or the power supplied to the coils 833 and/or electrostatic chuck 817. The controller 830 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the coils 833 and/or chuck 817 may be controlled to provide particular RF power levels. If a grid 850 is used, the RF powers may be adjusted by the system controller 830 to create an electron-ion plasma in the upper sub-chamber 802 and ion-ion plasma in the lower sub-chamber 803. Further, the controller 830 may be configured to supply power to an electrostatic chuck 817 under conditions such that an electron-ion plasma does not form in the lower sub-chamber 803.

The system controller 830 may control these and other aspects based on sensor output (e.g., when power, potential, pressure, etc. reach a certain threshold), the timing of an operation (e.g., opening valves at certain times in a process), or based on received instructions from the user.

In some implementations, a controller 830 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 830, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 830 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 830 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 830, in some implementations, may be a part of or coupled to a computer that is integrated with, coupled to the system, otherwise networked to the system, or a combination thereof. For example, the controller 830 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 830 receives instructions in the form of data, which specify parameters for each of the processing steps to be performed during one or more operations. It should be understood that the parameters may be specific to the type of process to be performed and the type of tool that the controller 830 is configured to interface with or control. Thus as described above, the controller 830 may be distributed, such as by comprising one or more discrete controllers that are networked together and working towards a common purpose, such as the processes and controls described herein. An example of a distributed controller 830 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 830 might communicate with one or more of other tool circuits or modules, other tool components, cluster tools, other tool interfaces, adjacent tools, neighboring tools, tools located throughout a factory, a main computer, another controller 830, or tools used in material transport that bring containers of wafers to and from tool locations and/or load ports in a semiconductor manufacturing factory.

Chambers shown in FIG. 7A-7C and FIG. 8 may be part of an apparatus or tool, such as the one shown in FIG. 9. Note that although an example cluster tool is depicted in FIG. 9, any suitable tool may be used to perform disclosed embodiments. In various embodiments, wafers may be transferred between stations in vacuum or without an air break using such a tool.

FIG. 9 depicts a semiconductor process cluster architecture with various modules that interface with a vacuum transfer module (VTM) 938. The arrangement of various modules to "transfer" wafers among multiple storage facilities and processing modules may be referred to as a "cluster tool architecture" system. Airlock 930, also known as a loadlock or transfer module, interfaces with the VTM 938 which, in turn, interfaces with four processing modules 920a-920d, which may be individual optimized to perform various fabrication processes. By way of example, processing modules 920a-920d may be implemented to perform substrate etching, deposition, ion implantation, wafer cleaning, sputtering, and/or other semiconductor processes. In some embodiments, disclosed embodiments are performed in the same module. In some embodiments, disclosed embodiments are performed in different modules of the same tool. One or more of the substrate processing modules (any of 920a-920d) may be implemented as disclosed herein, i.e., for pre-cleaning a substrate, depositing a film such as a rare earth metal-containing film, performing vertical etching, annealing, performing lateral etching, exposing a substrate to different gases, and other suitable functions in accordance with the disclosed embodiments. Airlock 930 and processing modules 920a-920d may be referred to as "stations." Each station has a facet 936 that interfaces the station to VTM 938. Inside each facet, sensors 1-18 are used to detect the passing of wafer 926 when moved between respective stations.

Robot 922 transfers wafer 926 between stations. In one embodiment, robot 922 has one arm, and in another embodiment, robot 922 has two arms, where each arm has an end effector 924 to pick wafers such as wafer 926 for transport. Front-end robot 932, in atmospheric transfer module (ATM) 940, is used to transfer wafers 926 from cassette or Front Opening Unified Pod (FOUP) 934 in Load Port Module (LPM) 942 to airlock 930. Module center 928 inside processing module 920a-920d is one location for placing wafer 926. Aligner 944 in ATM 940 is used to align wafers.

In an exemplary processing method, a wafer is placed in one of the FOUPs 934 in the LPM 942. Front-end robot 932 transfers the wafer from the FOUP 934 to an aligner 944, which allows the wafer 926 to be properly centered before it is etched or processed. After being aligned, the wafer 926 is moved by the front-end robot 932 into an airlock 930. Because the airlock 930 has the ability to match the environment between an ATM 940 and a VTM 938, the wafer 926 is able to move between the two pressure environments without being damaged. From the airlock 930, the wafer 926 is moved by robot 922 through VTM 938 and into one of the processing modules 920a-920d. In order to achieve this wafer movement, the robot 922 uses end effectors 924 on each of its arms. Once the wafer 926 has been processed, it is moved by robot 922 from the processing modules 920a-920d to the airlock 930. From here, the wafer 926 may be moved by the front-end robot 932 to one of the FOUPs 934 or to the aligner 944.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 8 may be implemented with the tool in FIG. 9.

EXPERIMENTAL

Experiment 1

An experiment was conducted for depositing conformal yttrium-containing films over substrates using a gas precursor and a plasma. Substrates were prepared by pre-cleaning the substrate with HF and exposing to $H_2$ plasma.

Figure 10A:
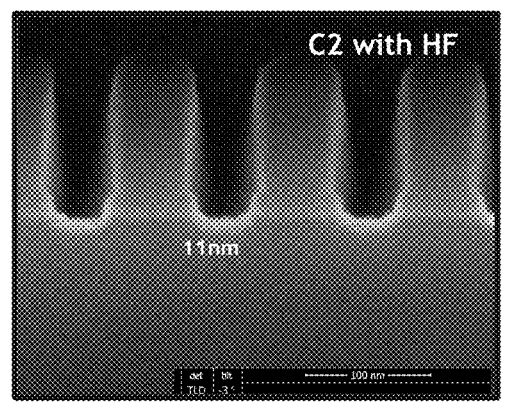
FIG. 10A-10C are SEM images of substrates after deposition of a yttrium-containing film.

In the first trial, a pre-cleaned patterned substrate was exposed to tris(butylcyclopentadienyl)yttrium(III) gas at a substrate temperature of 360° C. in a chamber having a pressure of 50 mTorr. The yttrium-containing film was deposited conformally and deposited at the bottom of features in the substrate to a thickness of 11 nm. FIG. 10A shows an SEM image of the resulting substrate.

Figure 10B:
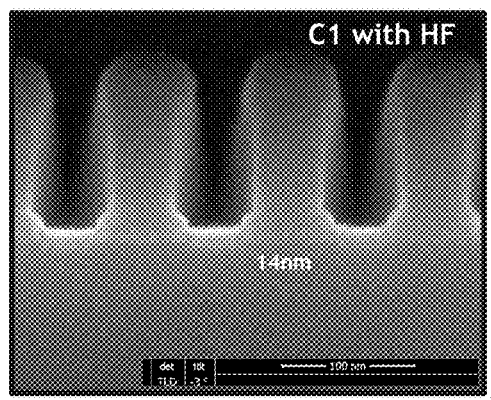

In the second trial, a pre-cleaned patterned substrate was exposed to a plasma generated by igniting a tris(butylcyclopentadienyl)yttrium(III) gas at a substrate temperature of 360° C. in a chamber having a pressure of 50 mTorr. The yttrium-containing film was deposited conformally and deposited at the bottom of features in the substrate to a thickness of 14 nm. FIG. 10B shows an SEM image of the resulting substrate.

Figure 10C:
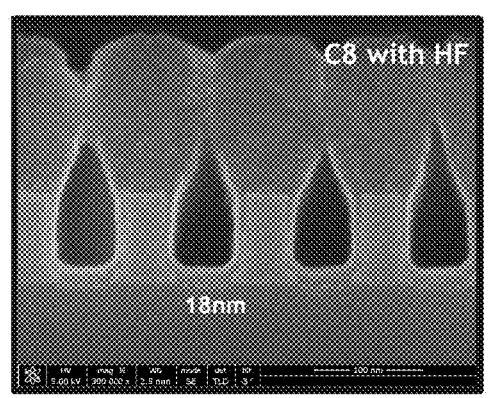

In the third trial, a pre-cleaned patterned substrate was exposed to a plasma generated by igniting a tris(butylcyclopentadienyl)yttrium(III) gas at a substrate temperature of 360° C. in a chamber having a pressure of 130 mTorr. The yttrium-containing film was deposited conformally and deposited at the bottom of features in the substrate to a thickness of 18 nm. FIG. 10C shows an SEM image of the resulting substrate.

Plasma-deposited films exhibited greater deposition thickness and a higher pressure also resulted in deposition of a thicker film.

Experiment 2

Figure 11:
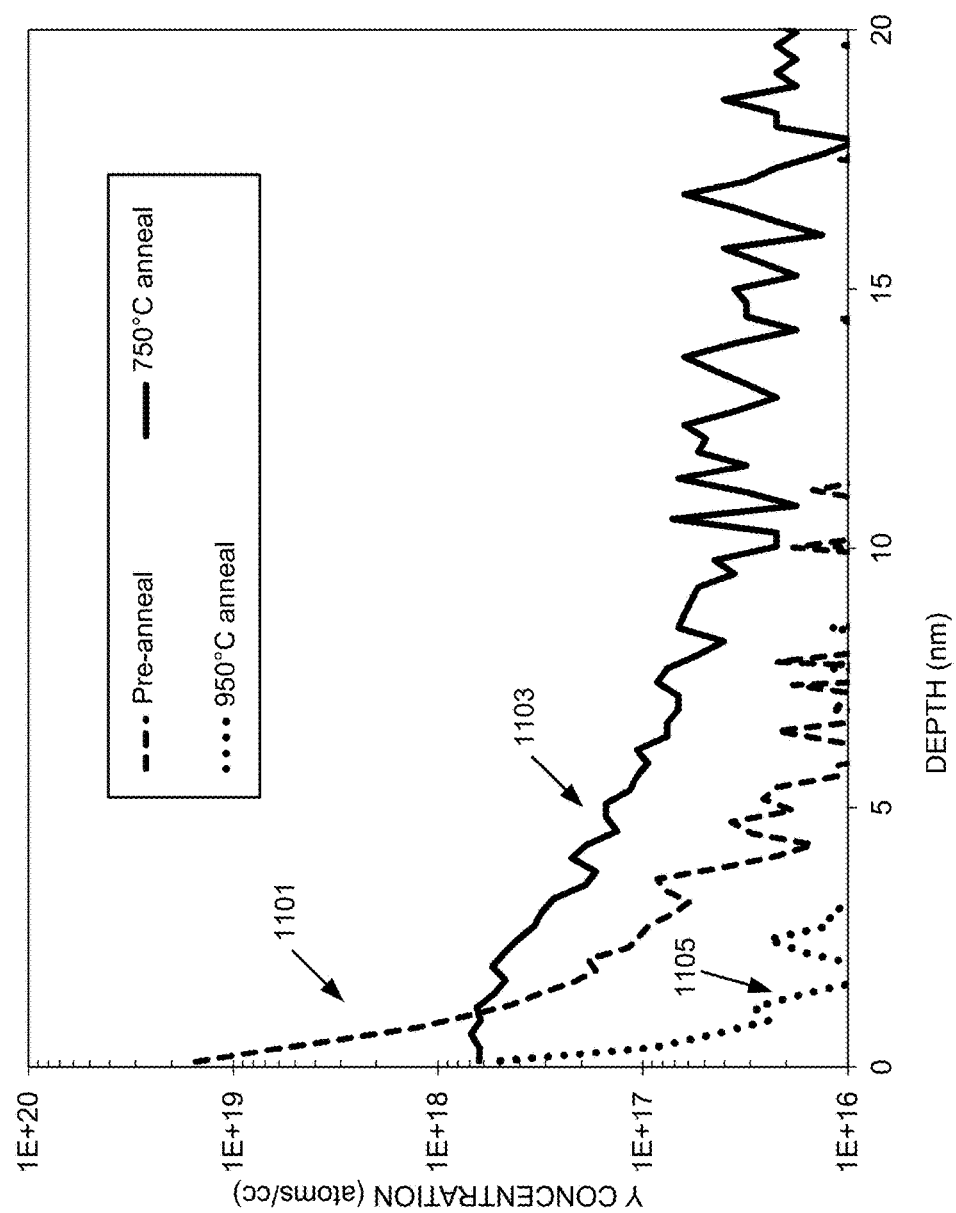
FIG. 11 is a graph of yttrium concentration vs. depth at certain annealing temperatures for substrates processed in accordance with certain disclosed embodiments.

An experiment was conducted for yttrium concentration at various depths of silicon semiconductor substrates. A substrate was exposed to a plasma generated by igniting a tris(butylcyclopentadienyl)yttrium(III) gas at a substrate temperature of 350° C. in a chamber having a pressure of 50 mTorr. The yttrium concentration was plotted against deposition depth as represented by the dotted line 1101 in FIG. 11. A substrate was annealed at a temperature of 750° C., which resulted in deeper doping and more diffusion of yttrium in the silicon substrate as represented by the solid line 1103 in FIG. 11. A substrate annealed at a temperature of 950° C. resulted in shallow doping of yttrium in the silicon substrate due to out diffusion as represented by the dotted line 1105 in FIG. 11. Substrates were annealed by rapid thermal annealing. High temperature annealing at 950° C. resulted in less diffusion in the silicon substrate.

Experiment 3

Figure 12A:
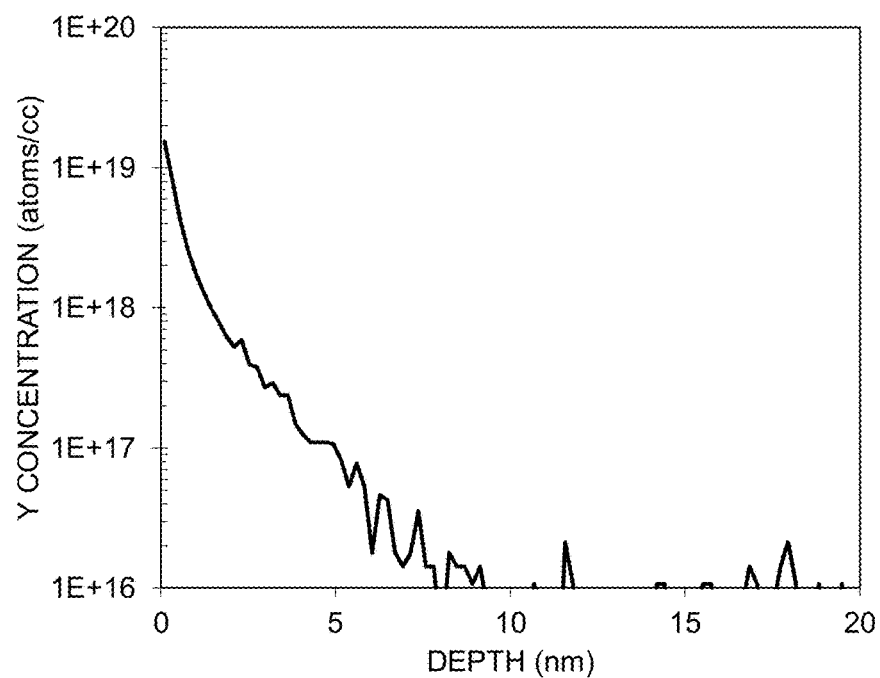
FIGS. 12A and 12B are graphs of yttrium concentration vs. depth at certain deposition durations for substrates processed in accordance with certain disclosed embodiments.

An experiment was conducted for yttrium concentration at various depths of silicon semiconductor substrates for certain deposition times. A substrate was exposed to tris(butylcyclopentadienyl)yttrium(III) gas for 120 seconds at a substrate temperature of 350° C. in a chamber having a pressure of 130 mTorr with a helium carrier gas. The resulting yttrium concentration is shown in FIG. 12A. These results suggest that using a gas-only deposition without plasma may also be suitable to achieve yttrium diffusion.

Figure 12B:
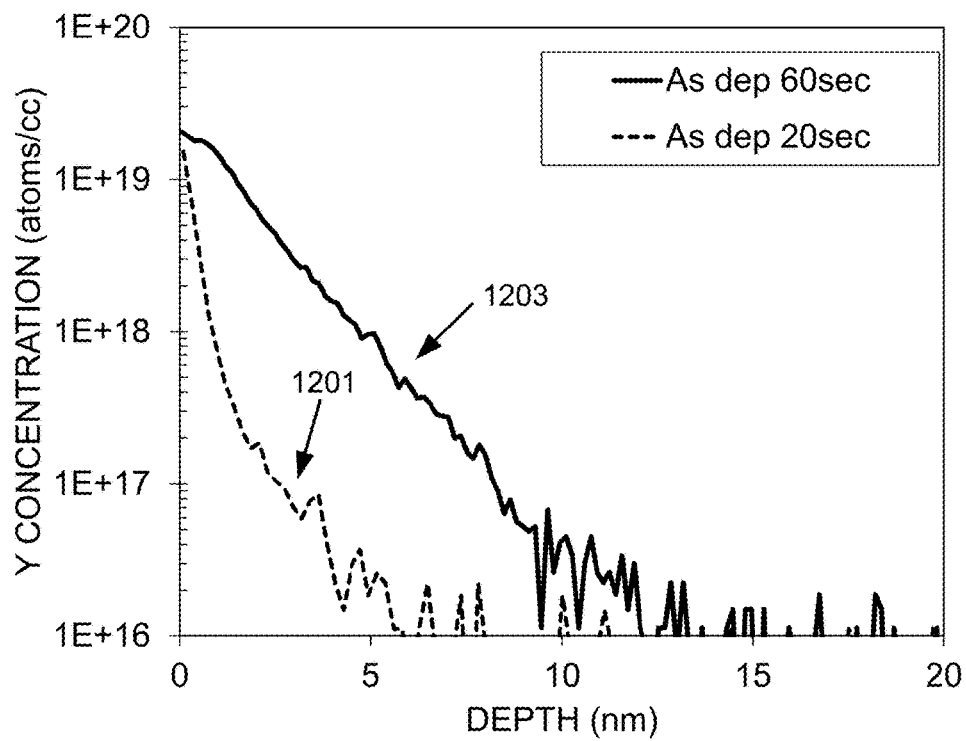

A substrate was exposed to a plasma generated by igniting a tris(butylcyclopentadienyl) yttrium(III) gas for 20 seconds at a substrate temperature of 350° C. in a chamber having a pressure of 130 mTorr with a helium carrier gas. The yttrium concentration was plotted against deposition depth as represented by the solid line 1201 in FIG. 12B. A substrate was exposed to a plasma generated by igniting a tris(butylcyclopentadienyl)yttrium(III) gas for 60 seconds at a substrate temperature of 350° C. in a chamber having a pressure of 130 mTorr with a helium carrier gas. The yttrium concentration was plotted against deposition depth as represented by the dotted line 1203 in FIG. 12B. A longer deposition time resulted in a thicker deposited yttrium-containing film on the silicon substrate and allowed deeper diffusion of yttrium into silicon.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate housed in a process chamber, the method comprising:
   introducing a rare earth metal source to the process chamber;
   depositing a conformal rare earth metal-containing film on a silicon-containing material on the substrate; and
   annealing the substrate at a temperature less than 500° C. to dope the silicon-containing material with the rare earth metal to form a rare earth metal-doped non-silicide semiconductor material on a surface of the silicon-containing material on the substrate,
   wherein the rare earth metal-doped non-silicide semiconductor material is doped about 5 nm to about 20 nm into a surface of the silicon-containing material,
   wherein the rare earth metal source comprises a plasma generated by igniting a rare earth metal-containing precursor, and
   wherein the conformal rare earth metal-containing film is deposited over a source or drain region of a FinFET.

2. The method of claim 1, wherein the conformal rare earth metal-containing film is deposited to a thickness between about 2 nm and about 5 nm.

3. The method of claim 1, wherein the substrate is patterned.

4. The method of claim 1, wherein the substrate comprises features having feature openings of less than about 10 nm.

5. The method of claim 4, wherein the features have aspect ratios greater than about 1.5:1.

6. The method of claim 1, wherein the rare earth metal source comprises yttrium.

7. The method of claim 3, wherein the rare earth metal source is selected from the group consisting of tris(butylcyclopentadienyl)yttrium(III), tris(cyclopentadienyl)yttrium (III), tris[N,N-bis(trimethylsilyl)amide]yttrium, yttrium(III) fluoride, yttrium(III) iodide, and yttrium(III) chloride.

8. The method of claim 7, wherein the rare earth metal source is tris(butylcyclopentadienyl)yttrium(III).

9. The method of claim 1, wherein the conformal rare earth metal-containing film is deposited without applying a bias.

10. The method of claim 1, wherein the silicon-containing material is selected from the group consisting of silicon, silicon germanium, and silicon carbide.

11. The method of claim 1, further comprising, prior to introducing the rare earth metal source to the process chamber and prior to depositing the conformal rare earth metal-containing film, pre-cleaning the substrate by exposing the substrate to hydrofluoric acid.

12. The method of claim 1, wherein the substrate is annealed using rapid thermal annealing.

13. The method of claim 1, wherein the silicon-containing material is silicon.

14. The method of claim 1, wherein the annealing is performed for a duration between about 5 seconds and about 180 seconds.

* * * * *